(12) United States Patent
Okawa

(10) Patent No.: US 11,948,869 B2
(45) Date of Patent: Apr. 2, 2024

(54) SEMICONDUCTOR DEVICE AND METHOD FOR MANUFACTURING THE SAME

(71) Applicants: Kabushiki Kaisha Toshiba, Tokyo (JP); Toshiba Electronic Devices & Storage Corporation, Tokyo (JP)

(72) Inventor: Naoki Okawa, Ibo Hyogo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 134 days.

(21) Appl. No.: 17/366,208

(22) Filed: Jul. 2, 2021

(65) Prior Publication Data

US 2022/0301992 A1 Sep. 22, 2022

(30) Foreign Application Priority Data

Mar. 18, 2021 (JP) .................................. 2021-044298

(51) Int. Cl.
*H01L 23/495* (2006.01)
*H01L 21/48* (2006.01)
(Continued)

(52) U.S. Cl.
CPC .... *H01L 23/49562* (2013.01); *H01L 21/4828* (2013.01); *H01L 23/49517* (2013.01);
(Continued)

(58) Field of Classification Search
CPC ............. H01L 23/3142; H01L 23/3107; H01L 23/4951; H01L 23/4952; H01L 23/49548;
(Continued)

(56) References Cited

U.S. PATENT DOCUMENTS 10,199,312 B1 * 2/2019 Rivera-Marty ..... H01L 23/3114
10,340,207 B2 7/2019 Imori et al.
(Continued)

FOREIGN PATENT DOCUMENTS

| JP | 2008-112961 A | 5/2008 |
|----|---------------|--------|
| JP | 2017-028200 A | 2/2017 |

(Continued)

*Primary Examiner* — Yu Chen
(74) *Attorney, Agent, or Firm* — Allen & Overy LLP

(57) ABSTRACT

According to one embodiment, a semiconductor device includes a first conductive part, a semiconductor element, a first terminal, and a metal layer. The semiconductor element is located on the first conductive part. The first terminal is separated from the first conductive part in a second direction perpendicular to a first direction. The first direction is from the first conductive part toward the semiconductor element. The first terminal includes a first portion, and a second portion located between the first portion and the first conductive part. A lower surface of the second portion is positioned lower than a lower surface of the first portion and lower than a lower surface of a first insulating portion. The first insulating portion is located between the first conductive part and the second portion. The metal layer is located at the lower surfaces of the first portion and of the second portion.

8 Claims, 12 Drawing Sheets

(51) Int. Cl.
*H01L 21/56* (2006.01)
*H01L 23/31* (2006.01)

(52) U.S. Cl.
CPC ...... *H01L 23/49582* (2013.01); *H01L 21/561* (2013.01); *H01L 23/3107* (2013.01); *H01L 23/4951* (2013.01); *H01L 23/4952* (2013.01); *H01L 23/49548* (2013.01)

(58) Field of Classification Search
CPC ......... H01L 23/49582; H01L 23/49562; H01L 21/4828
See application file for complete search history.

(56) References Cited

U.S. PATENT DOCUMENTS

| | | | | |
|---|---|---|---|---|
| 2011/0244629 | A1* | 10/2011 | Gong | H01L 23/49582 438/111 |
| 2014/0035113 | A1* | 2/2014 | Kierse | H01L 21/4832 257/676 |
| 2017/0162520 | A1* | 6/2017 | Kaneko | H01L 23/3142 |
| 2017/0236772 | A1* | 8/2017 | Yamagami | H01L 23/49524 257/676 |
| 2019/0279921 | A1 | 9/2019 | Kadoi | |
| 2019/0385955 | A1* | 12/2019 | Shi | H01L 21/4832 |
| 2020/0098672 | A1 | 3/2020 | Hayashi et al. | |
| 2020/0176271 | A1* | 6/2020 | Nasu | H01L 23/49548 |
| 2022/0084912 | A1* | 3/2022 | Fukui | H01L 21/6836 |

FOREIGN PATENT DOCUMENTS

| | | |
|---|---|---|
| JP | 2017-228706 A | 12/2017 |
| JP | 2018-139263 A | 9/2018 |
| JP | 2019-021812 A | 2/2019 |
| JP | 2019-160882 A | 9/2019 |
| JP | 2020-053420 A | 4/2020 |
| WO | WO-2021215472 A1 * | 10/2021 |

* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2021-044298, filed on Mar. 18, 2021; the entire contents of which are incorporated herein by reference.

FIELD

Embodiments described herein relate generally to a semiconductor device and a method for manufacturing the same.

BACKGROUND

A semiconductor device includes a semiconductor element and a terminal. It is desirable to increase the mounting reliability of such a semiconductor device.

DETAILED DESCRIPTION

Figure 1:
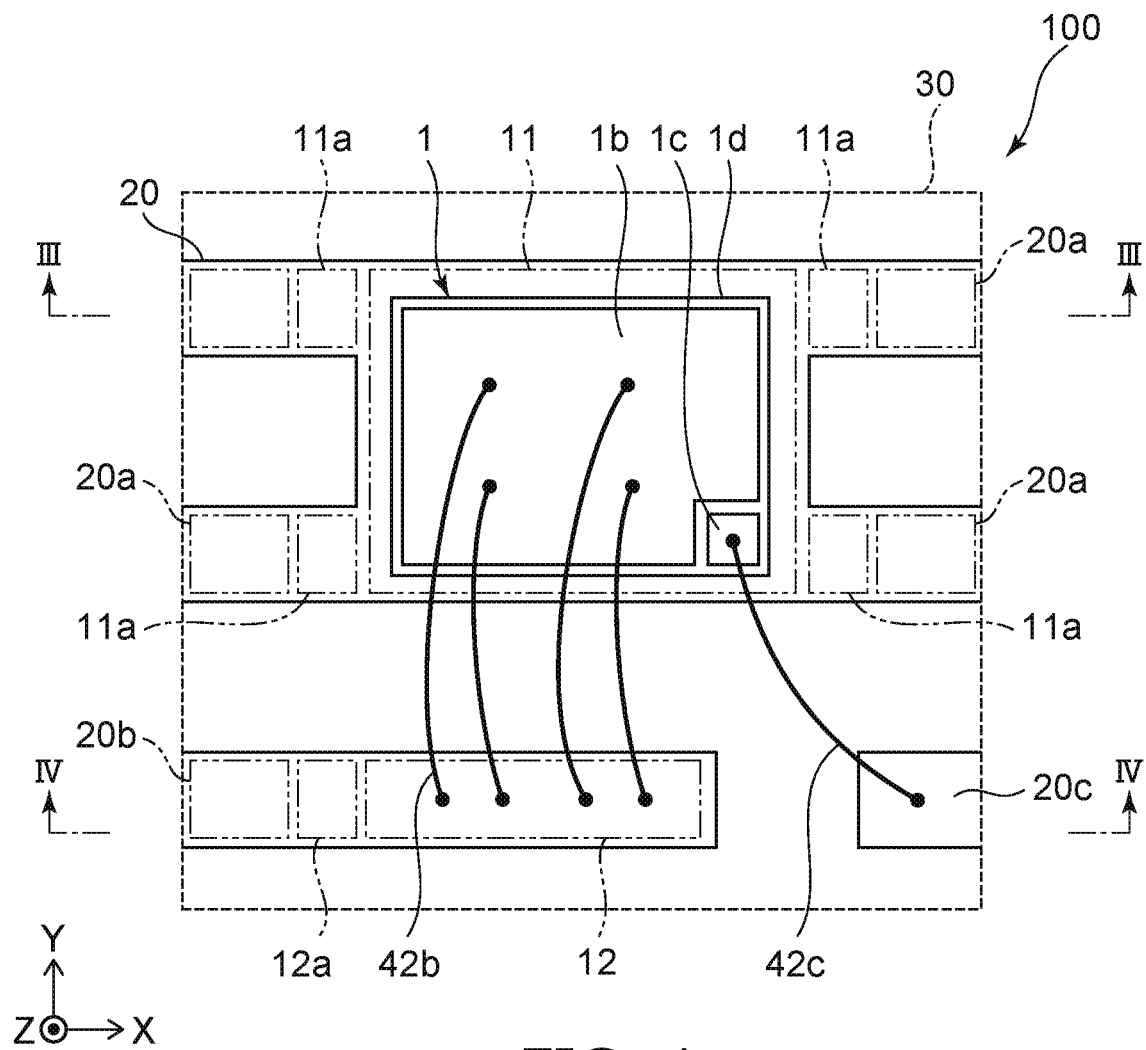
FIG. 1 is a plan view illustrating a semiconductor device according to an embodiment.

According to one embodiment, a semiconductor device includes a first conductive part, a semiconductor element, a first terminal, and a metal layer. The semiconductor element is located on the first conductive part. The first terminal is separated from the first conductive part in a second direction perpendicular to a first direction. The first direction is from the first conductive part toward the semiconductor element. The first terminal includes a first portion, and a second portion located between the first portion and the first conductive part. A lower surface of the second portion is positioned lower than a lower surface of the first portion and lower than a lower surface of a first insulating portion. The first insulating portion is located between the first conductive part and the second portion. The metal layer is located at the lower surface of the first portion and the lower surface of the second portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

Figure 2A:
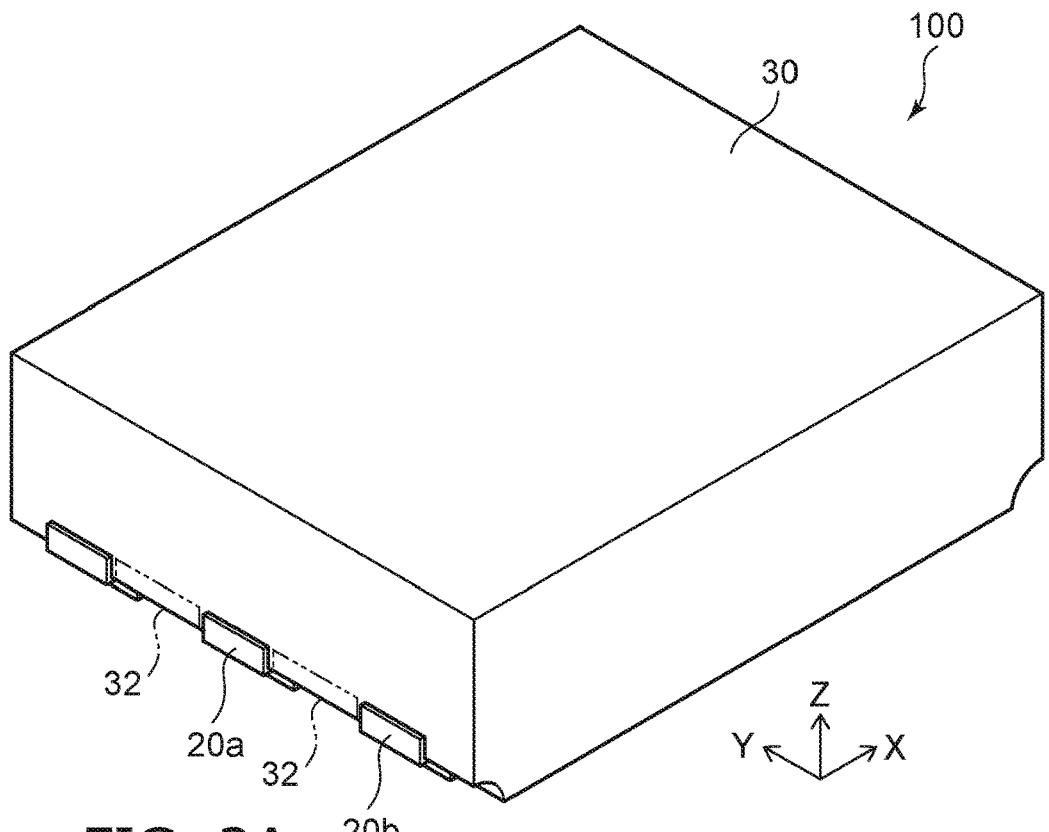
FIGS. 2A and 2B are perspective views illustrating the semiconductor device according to the embodiment.
Figure 2B:
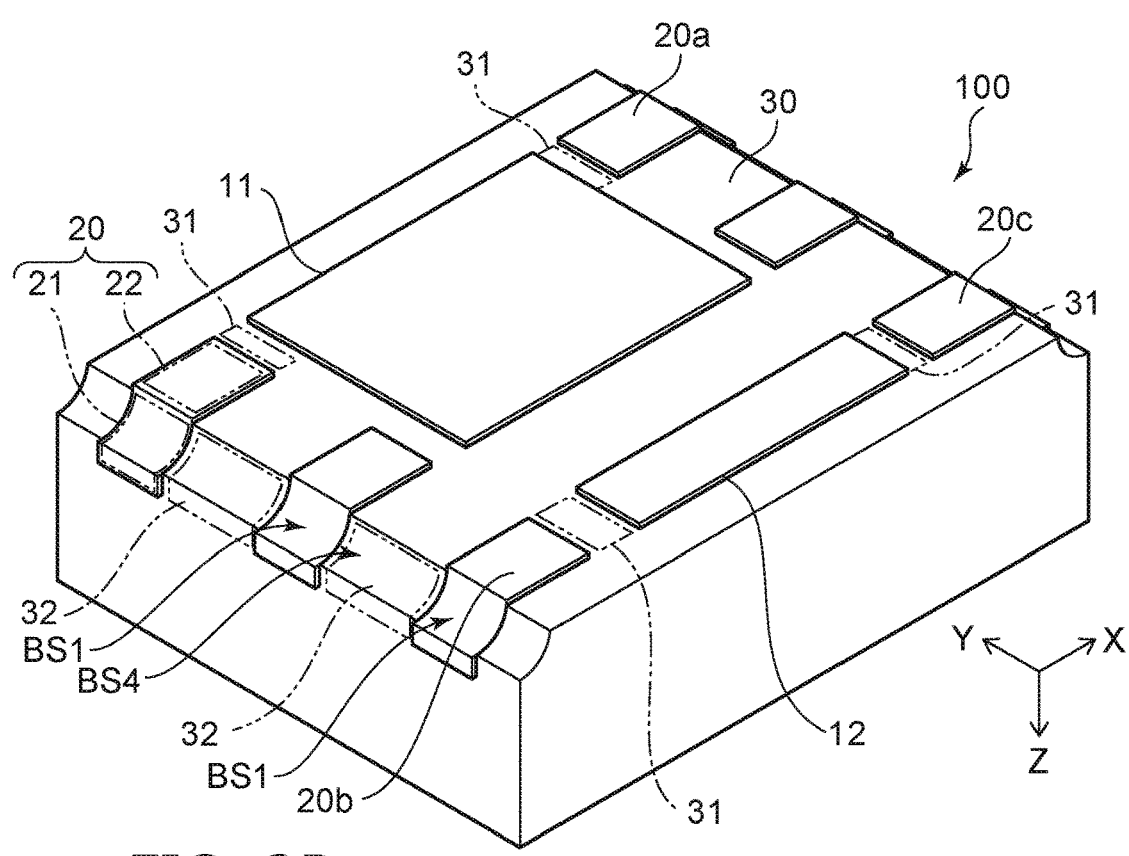

FIG. 1 is a plan view illustrating a semiconductor device according to an embodiment. FIGS. 2A and 2B are perspective views illustrating the semiconductor device according to the embodiment.

As shown in FIGS. 1, 2A, and 2B, the semiconductor device 100 according to the embodiment includes a semiconductor element 1, a first conductive part 11, a link part 11a, a second conductive part 12, a terminal 20, and an insulating portion 30. In FIG. 1, the insulating portion 30 is see-through and is illustrated by a broken line. The link part 11a is illustrated by a double dot-dash line in the drawings.

An XYZ orthogonal coordinate system is used in the description of the embodiments. A direction from the first conductive part 11 toward the semiconductor element 1 is taken as a Z-direction (a first direction). Two mutually-orthogonal directions perpendicular to the Z-direction are taken as an X-direction (a second direction) and a Y-direction (a third direction). In the description, the direction from the first conductive part 11 toward the semiconductor element 1 is called "up"; and the opposite direction is called "down". These directions are based on the relative positional relationship between the first conductive part 11 and the semiconductor element 1 and are independent of the direction of gravity.

The semiconductor element 1 is located on the first conductive part 11. In the example of FIG. 1, the semiconductor element 1 is a metal oxide semiconductor field effect transistor (MOSFET). The semiconductor element 1 may be an insulated gate bipolar transistor (IGBT) or a diode. The second conductive part 12 is separated from the first conductive part 11 in the Y-direction.

Multiple terminals 20 are arranged in the X-direction and the Y-direction. The multiple terminals 20 are separated from each other. Also, the multiple terminals 20 are separated from the first and second conductive parts 11 and 12 in the X-direction. The multiple terminals 20 include a first terminal 20a, a second terminal 20b, and a third terminal 20c. The first terminal 20a, the second terminal 20b, and the third terminal 20c are illustrated by double dot-dash lines in the drawings.

The first conductive part 11 is located between the first terminals 20a in the X-direction. The link part 11a is located between the first conductive part 11 and the first terminal 20a. The first terminal 20a is electrically connected with the first conductive part 11 via the link part 11a.

The second conductive part 12 is located between the second terminal 20b and the third terminal 20c in the X-direction. A link part 12a is located between the second conductive part 12 and the second terminal 20b. The second terminal 20b is electrically connected with the second conductive part 12 via the link part 12a.

FIGS. 3A, 3B, 4A, and 4B are cross-sectional views illustrating the semiconductor device according to the embodiment.

Figure 3A:
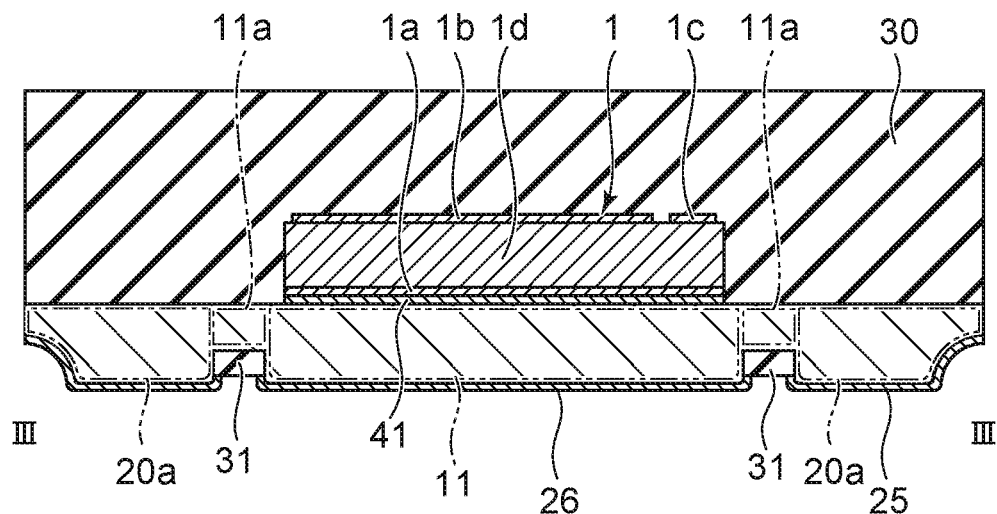
FIGS. 3A and 3B are cross-sectional views illustrating the semiconductor device according to the embodiment.
Figure 3B:
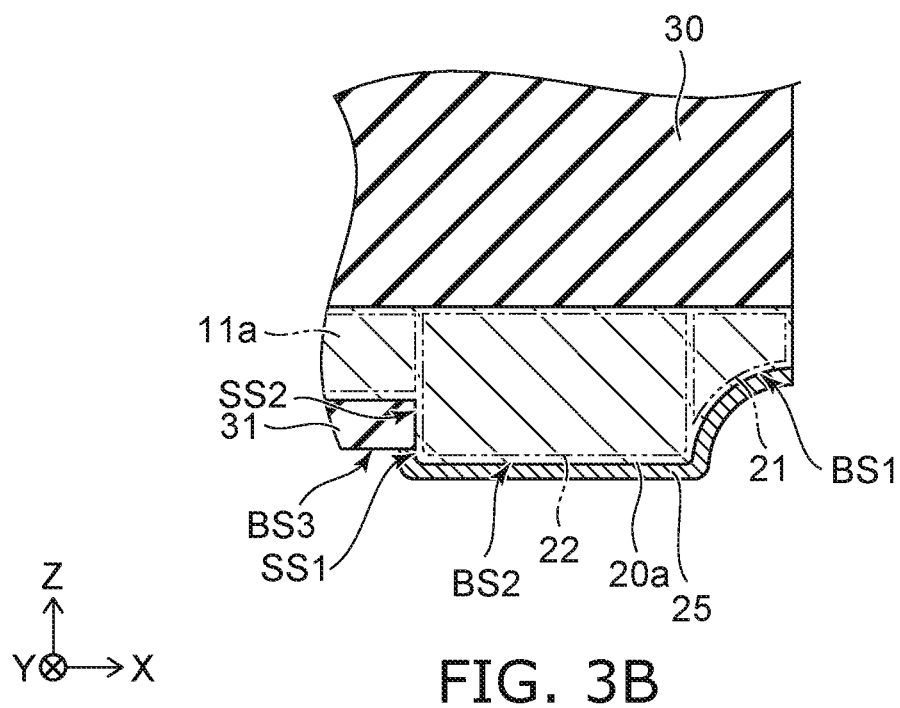
Figure 4A:
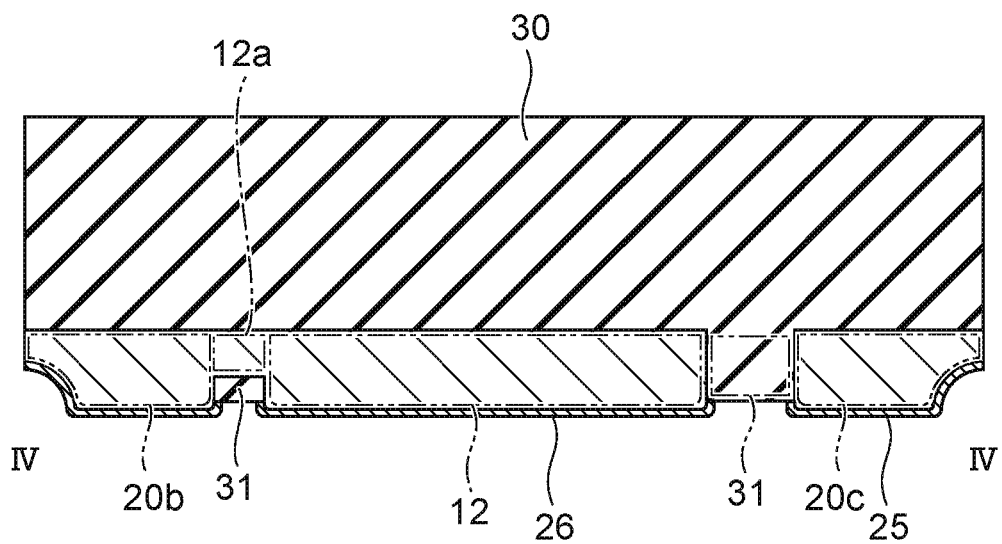
FIGS. 4A and 4B are cross-sectional views illustrating the semiconductor device according to the embodiment.
Figure 4B:
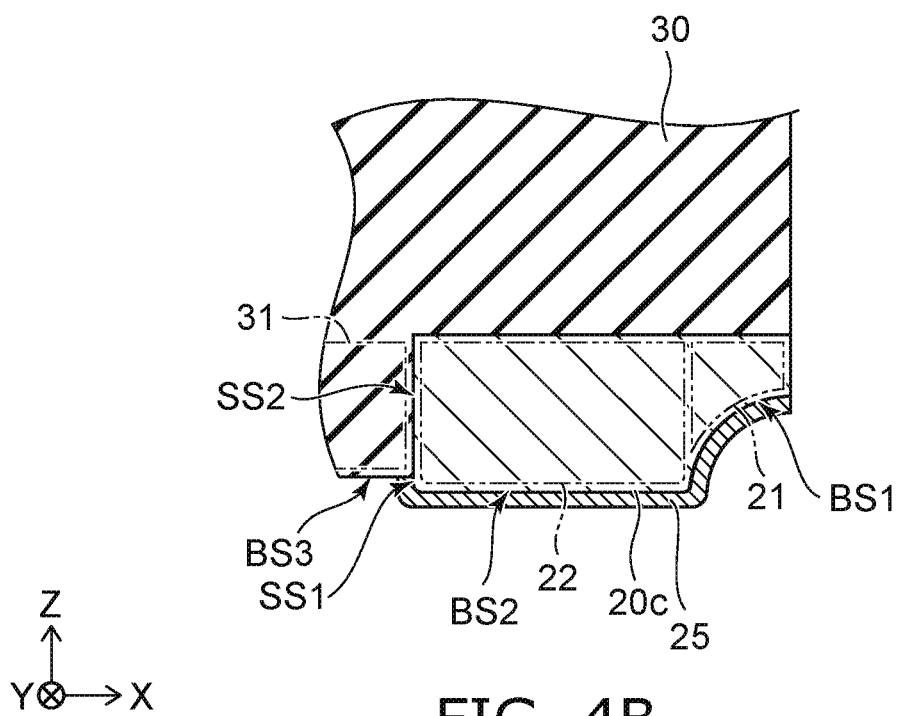

Specifically, FIG. 3A is a III-III cross-sectional view of FIG. 1. FIG. 3B is a partially enlarged view of FIG. 3A. FIG. 4A is a IV-IV cross-sectional view of FIG. 1. FIG. 4B is a partially enlarged view of FIG. 4A.

As shown in FIGS. 1 and 3A, the semiconductor element 1 includes a drain electrode 1a, a source electrode 1b, a gate pad 1c, and a semiconductor layer 1d. The drain electrode 1a is located at the lower surface of the semiconductor element 1. The source electrode 1b and the gate pad 1c are located at the upper surface of the semiconductor element 1. The semiconductor layer 1d is located between the drain electrode 1a and the source electrode 1b and between the drain electrode 1a and the gate pad 1c.

As shown in FIG. 3A, the drain electrode 1a is electrically connected with the first conductive part 11 via a bonding layer 41. As shown in FIG. 1, the source electrode 1b is electrically connected with the second conductive part 12 via a bonding wire 42b. The gate pad 1c is electrically connected with the third terminal 20c via a bonding wire 42c.

The insulating portion 30 is located at the periphery of the semiconductor element 1 and seals the semiconductor element 1. The insulating portion 30 includes multiple first insulating portions 31. The multiple first insulating portions 31 are located between the first conductive part 11 and the terminal 20 and between the second conductive part 12 and another terminal 20 in the X-direction.

Specifically, as shown in FIG. 3A, the thickness (the length in the Z-direction) of the link part 11a is less than the thicknesses of the first conductive part 11 and the first terminal 20a. The first insulating portion 31 is located under the link part 11a, and is positioned between the first conductive part 11 and the first terminal 20a.

As shown in FIG. 4A, the thickness of the link part 12a is less than the thicknesses of the second conductive part 12 and the second terminal 20b. Another first insulating portion 31 is located under the link part 12a, and is positioned between the second conductive part 12 and the second terminal 20b. Yet another first insulating portion 31 is positioned between the second conductive part 12 and the third terminal 20c.

As shown in FIGS. 3B and 4B, the terminal 20 includes a first portion 21 and a second portion 22. The first portion 21 and the second portion 22 are illustrated by double dot-dash lines in the drawings.

The second portion 22 is located more centrally than the first portion 21 in the semiconductor device 100. When the semiconductor device 100 is viewed from the Y-direction, the second portion 22 is positioned between the first conductive part 11 and the first portion 21. More specifically, in the first terminal 20a, the second portion 22 is positioned between the first conductive part 11 and the first portion 21 in the X-direction. In the second and third terminals 20b and 20c, the second portion 22 is located between the second conductive part 12 and the first portion 21 in the X-direction.

The first portion 21 includes a lower surface BS1. The second portion 22 includes a lower surface BS2. The lower surface BS1 and the lower surface BS2 are linked in the X-direction; and the lower surface BS2 is positioned further than the lower surface BS1 toward the semiconductor element 1 side (toward the X-direction center of the semiconductor device 100). The first insulating portion 31 includes a lower surface BS3. The lower surface BS1 extends in the Y-direction. The lower surface BS2 and the lower surface BS3 are parallel to the X-Y plane.

The lower surface BS2 is positioned lower than the lower surfaces BS1 and BS3. The lower surface BS3 is positioned lower than the lower surface BS1. The thickness of the second portion 22 is greater than the thickness of the first portion 21. The lower surface BS1 is curved to be upwardly convex. Therefore, the thickness of the first portion 21 decreases away from the first conductive part 11. Also, the change of the thickness decreases away from the first conductive part 11.

The second portion 22 includes a side surface SS1 (a first side surface) and a side surface SS2 (a second side surface). The side surface SS1 is positioned lower than the lower surface BS3 and crosses the X-direction. The side surface SS1 is not covered with the insulating portion 30. The side surface SS2 is positioned higher than the side surface SS1 and contacts the first insulating portion 31. In other words, the side surface SS1 and the side surface SS2 are linked in the Z-direction; and the side surface SS2 is positioned further than the side surface SS1 toward the semiconductor element 1 side (toward the Z-direction center of the semiconductor device 100).

A metal layer 25 is located at the surface of the terminal 20. Specifically, the metal layer 25 is located at the lower surface BS1, the lower surface BS2, and the side surface SS1. A metal layer 26 is located at the surface of the first conductive part 11 and the surface of the second conductive part 12. The metal layers 25 and 26 are not illustrated in FIGS. 2A and 2B.

As shown in FIGS. 2A and 2B, the insulating portion 30 further includes a second insulating portion 32 that is located between terminals 20 that are next to each other in the Y-direction. The second insulating portion 32 includes a lower surface BS4 that is next to the lower surface BS1 in the Y-direction. Similarly to the lower surface BS1, the lower surface BS4 is curved to be upwardly convex. Therefore, the thickness of the second insulating portion 32 decreases away from the first conductive part 11. Also, the change of the thickness decreases away from the first conductive part 11.

Examples of the materials of the components of the semiconductor device 100 will now be described.

The drain electrode 1a, the source electrode 1b, and the gate pad 1c include a metal such as aluminum, etc. The semiconductor layer 1d includes silicon, silicon carbide, gallium nitride, or gallium arsenide as a semiconductor material. The first conductive part 11, the second conductive part 12, and the terminal 20 include a metal such as copper, aluminum, etc. The metal layers 25 and 26 include a metal such as copper, silver, etc. The insulating portion 30 includes an insulating resin such as polyimide, etc. The bonding layer 41 includes a metal such as copper, silver, tin, etc. The bonding wires 42b and 42c include a metal such as aluminum, etc.

A method for manufacturing the semiconductor device 100 according to the embodiment will now be described.

FIGS. 5 to 10 are schematic views illustrating the method for manufacturing the semiconductor device according to the embodiment.

Figure 5:
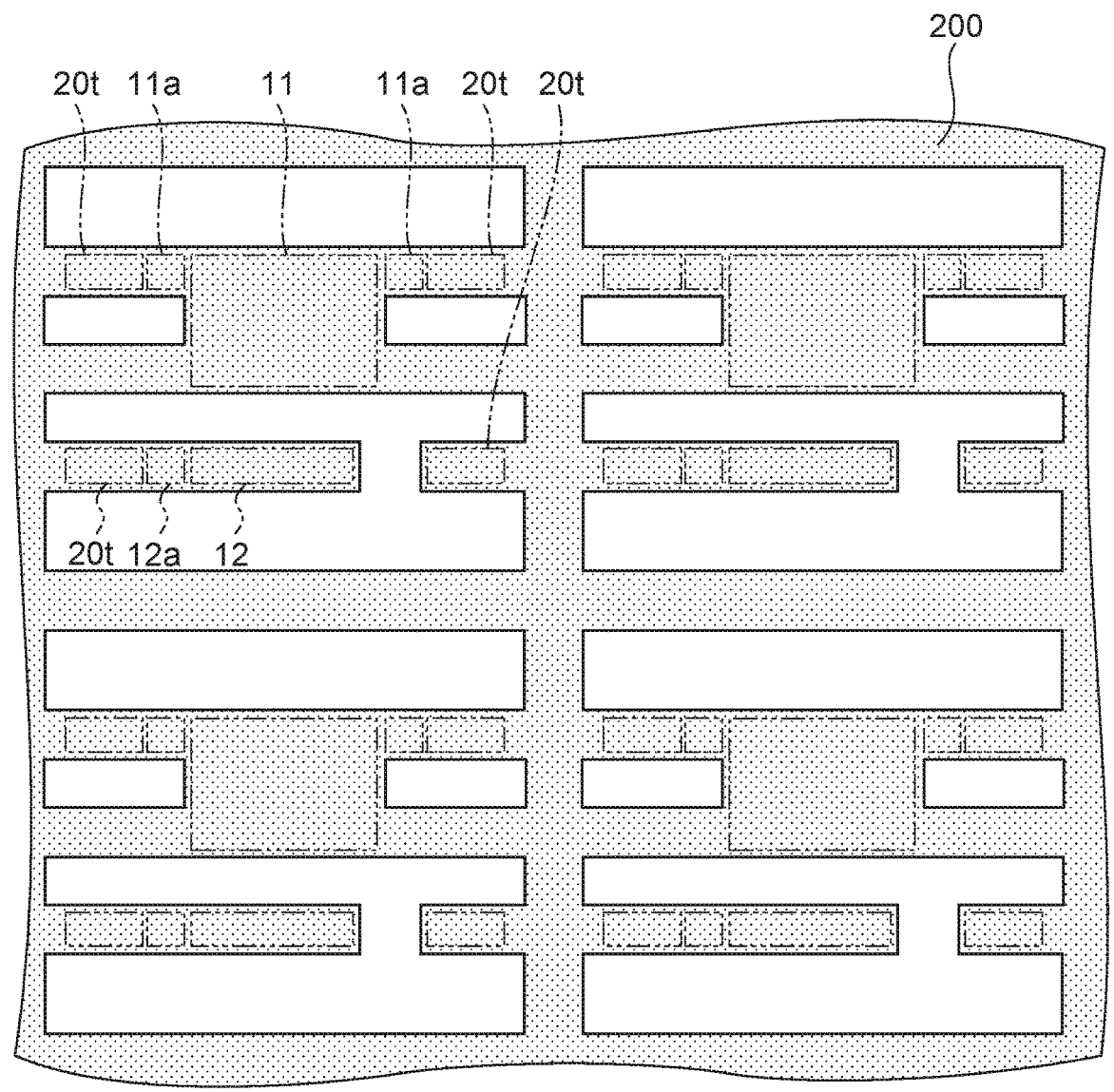
FIG. 5 is a schematic view illustrating a method for manufacturing the semiconductor device according to the embodiment.

A leadframe 200 shown in FIG. 5 is prepared. The leadframe 200 includes the first conductive part 11, the link part 11a, the second conductive part 12, the link part 12a, and a terminal part 20t. Multiple terminal parts 20t are arranged in the X-direction and the Y-direction. The multiple terminal parts 20t are respectively separated from the first and second conductive parts 11 and 12 in the X-direction. The terminal part 20t is formed into the terminal 20 by forming.

Figure 6:
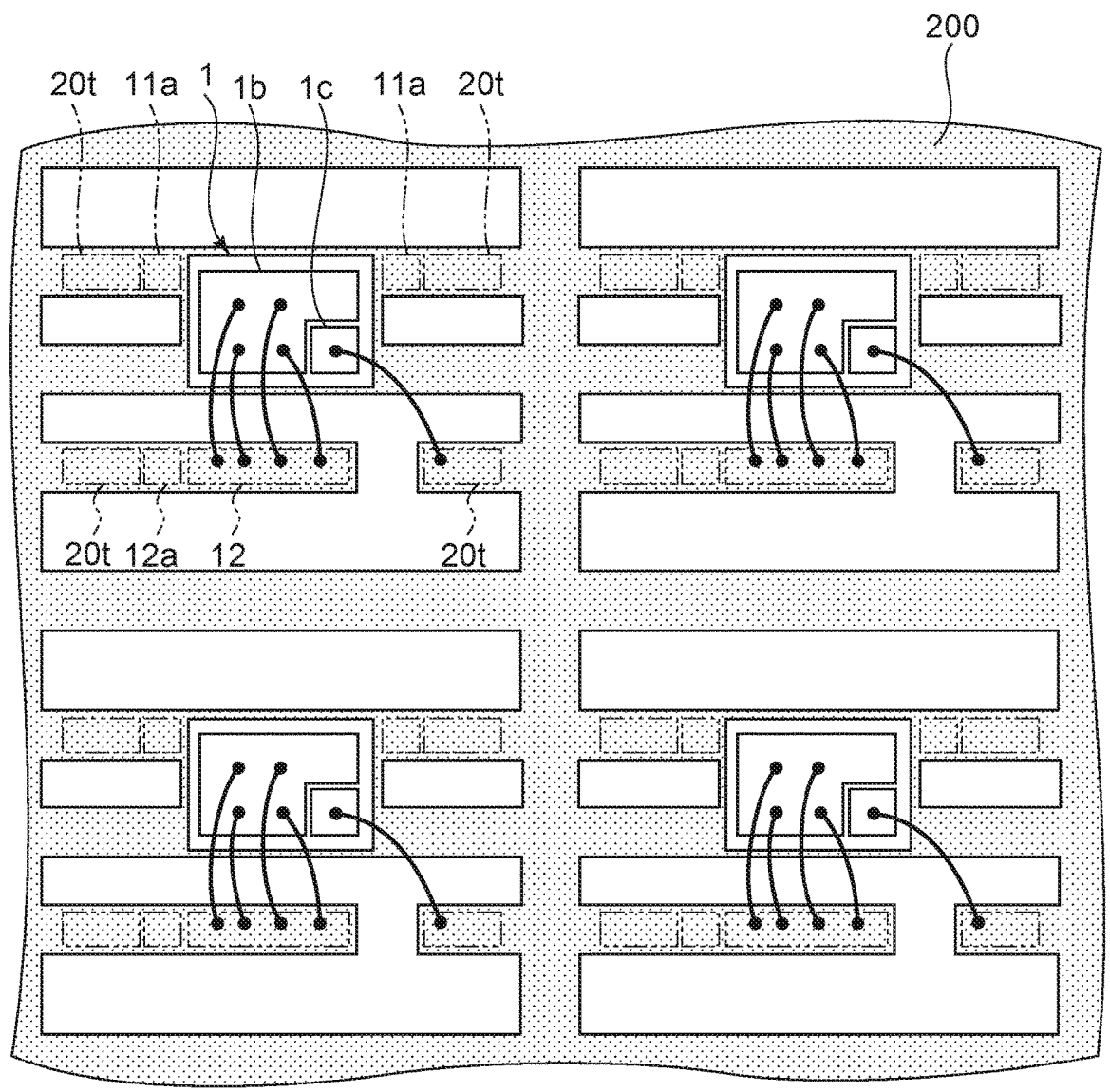
FIG. 6 is a schematic view illustrating the method for manufacturing the semiconductor device according to the embodiment.

As shown in FIG. 6, the semiconductor element 1 is bonded on the first conductive part 11; and the drain electrode 1a of the semiconductor element 1 is electrically connected with the first conductive part 11. The source electrode 1b and the gate pad 1c of the semiconductor element 1 are electrically connected respectively with the multiple terminal parts 20t by wire bonding.

Figure 7A:
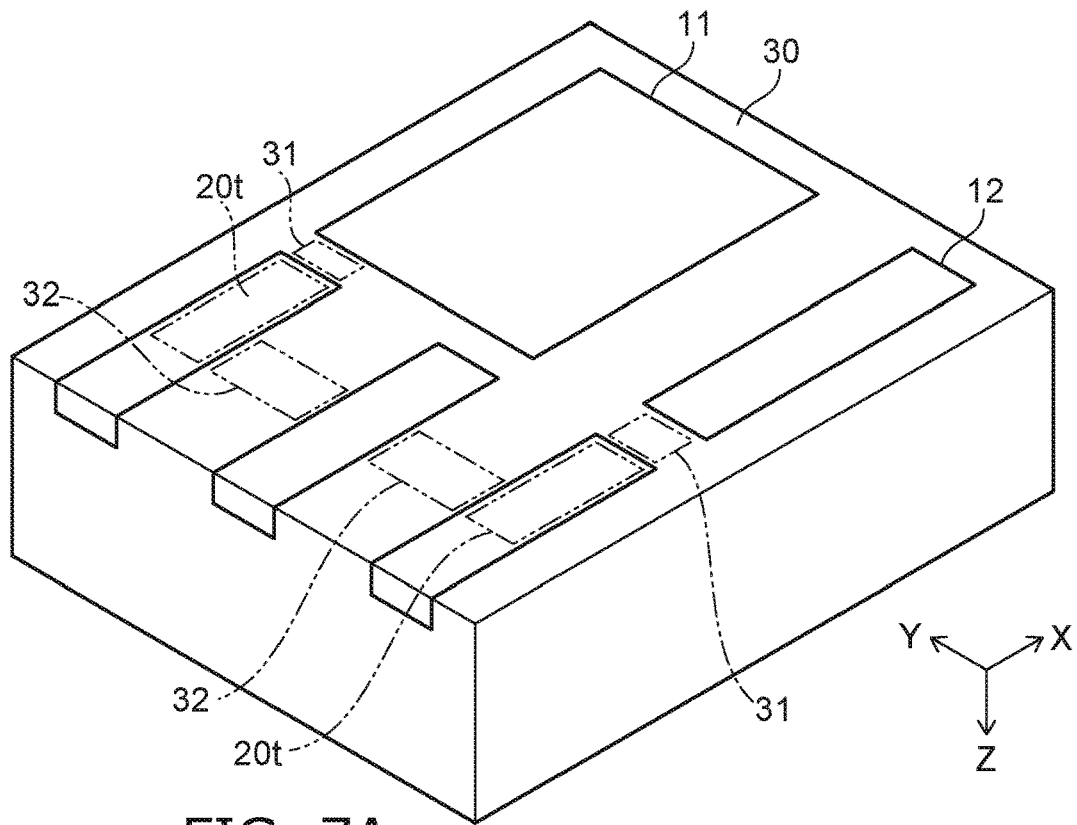
FIGS. 7A and 7B are schematic views illustrating the method for manufacturing the semiconductor device according to the embodiment.
Figure 7B:
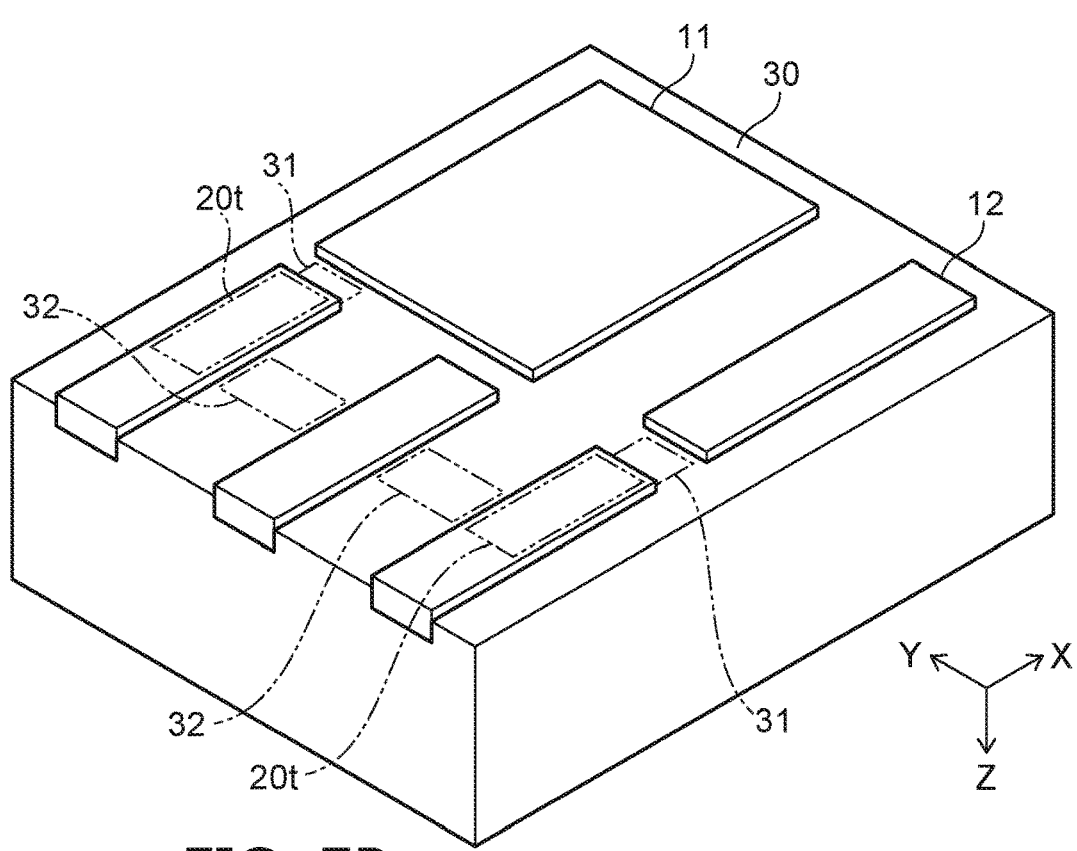
Figure 8:
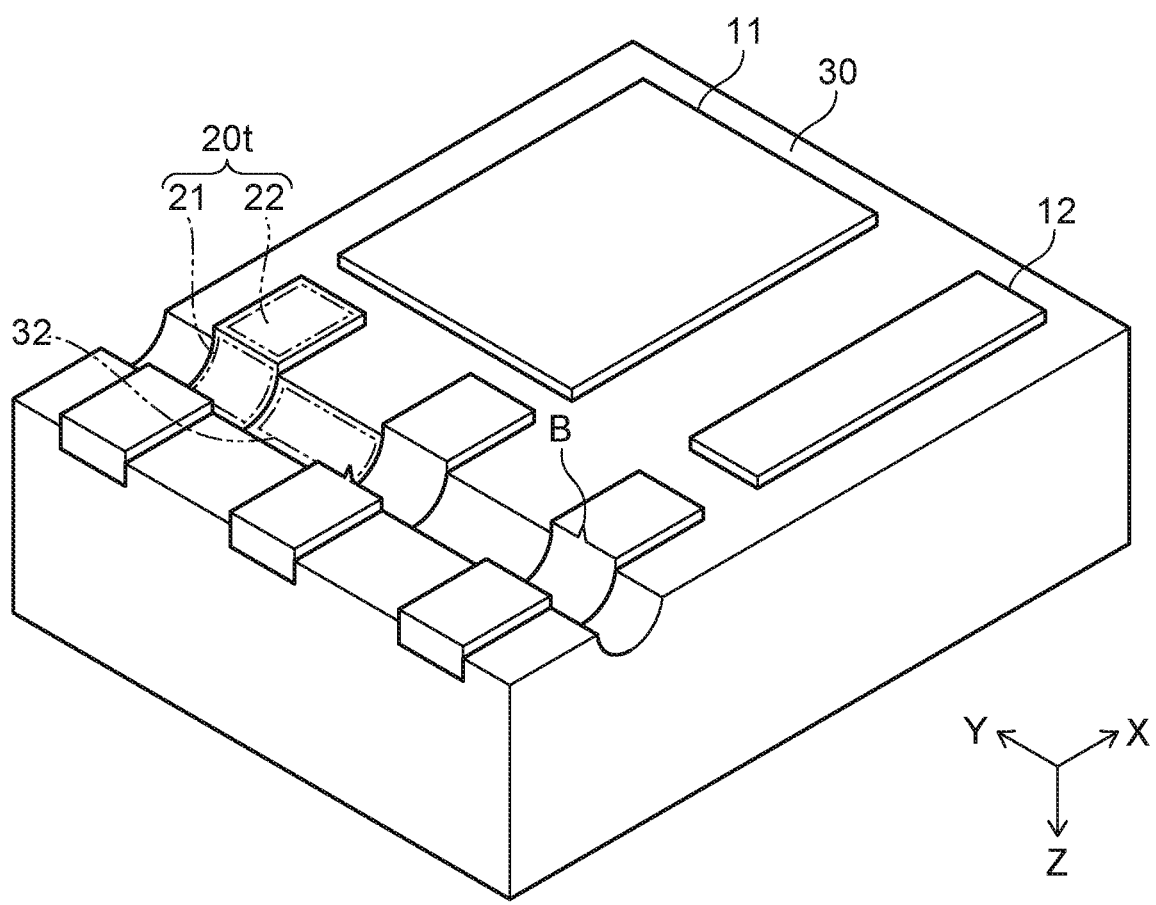
FIG. 8 is a schematic view illustrating the method for manufacturing the semiconductor device according to the embodiment.

FIGS. 7A, 7B, and 8 are perspective views when a portion of the leadframe 200 is viewed from below.

As shown in FIG. 7A, the semiconductor element 1 is sealed with the insulating portion 30. A structure body that includes the first conductive part 11, the second conductive part 12, the terminal part 20t, and the insulating portion 30 is obtained thereby. The lower surfaces of the first conductive part 11, the second conductive part 12, and the terminal part 20t are not covered with the insulating portion 30. The insulating portion 30 includes the first insulating portion 31 that is located between the first conductive part 11 and the second conductive part 12, and the second insulating portion 32 that is located between the terminal parts 20t that are next to each other in the Y-direction.

As shown in FIG. 7B, the surface of the insulating portion 30 is caused to recede by wet etching. Therefore, the lower surface of the leadframe 200 is positioned lower than the lower surface of the insulating portion 30. A portion of the side surface of the leadframe 200 is not covered with the insulating portion 30.

As shown in FIG. 8, a portion of the terminal part 20t and a portion of the second insulating portion 32 are removed by dicing. The thickness of the portion of the terminal part 20t and the thickness of the second insulating portion 32 are reduced by the dicing. As shown in FIG. 3B, the terminal part 20t that includes the first and second portions 21 and 22 is formed.

Burr B is formed at the lower surface of the terminal part 20t by the dicing. After the dicing, the leadframe 200 is immersed in an electrolytic solution. When the leadframe 200 includes copper, the electrolytic solution includes sodium carbonate. Electrolytic etching of the leadframe 200 is performed.

Figure 9A:
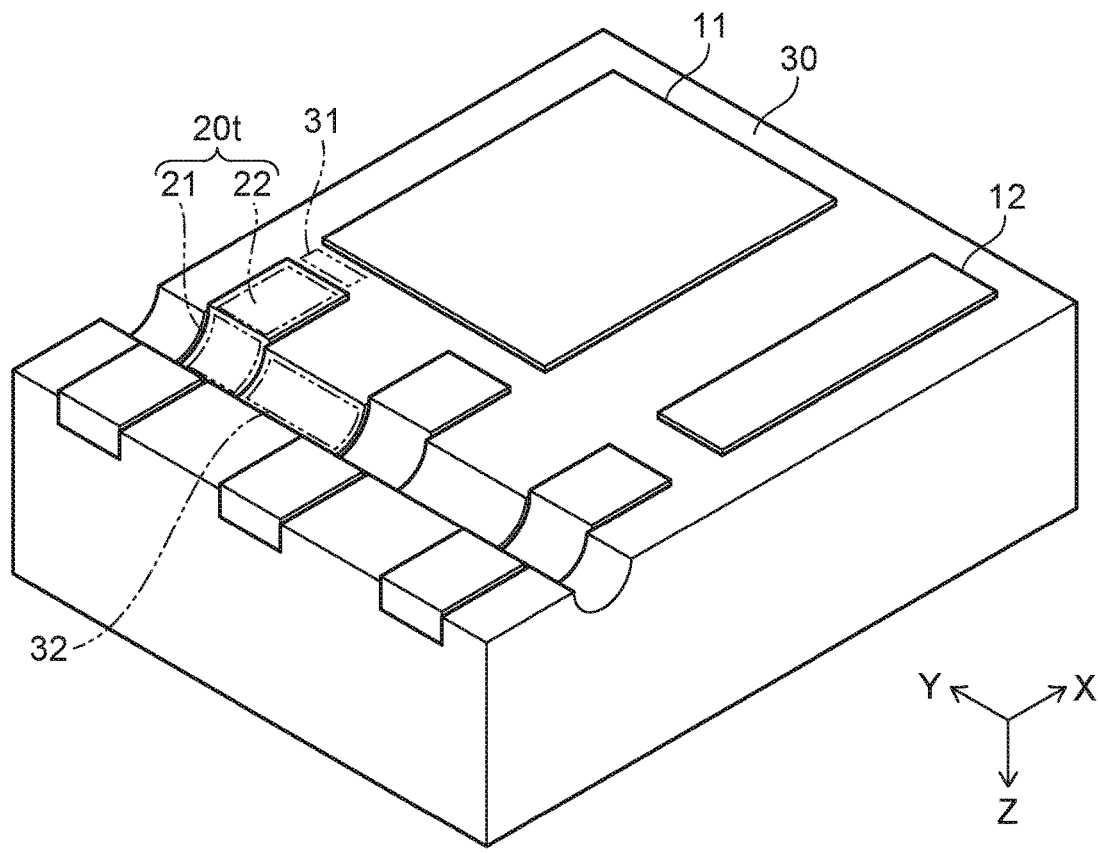
FIGS. 9A and 9B are schematic views illustrating the method for manufacturing the semiconductor device according to the embodiment.
Figure 9B:
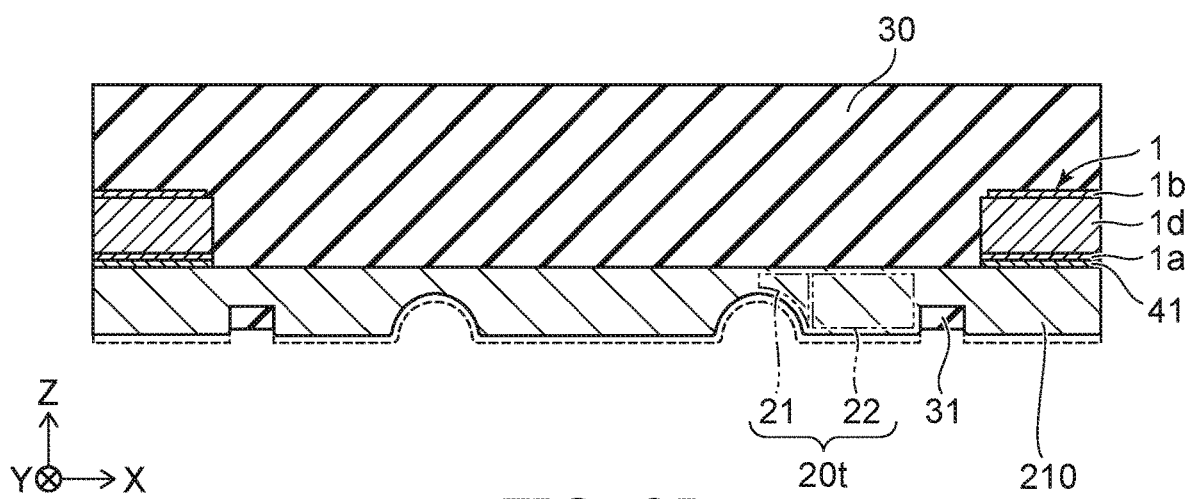
Figure 10:
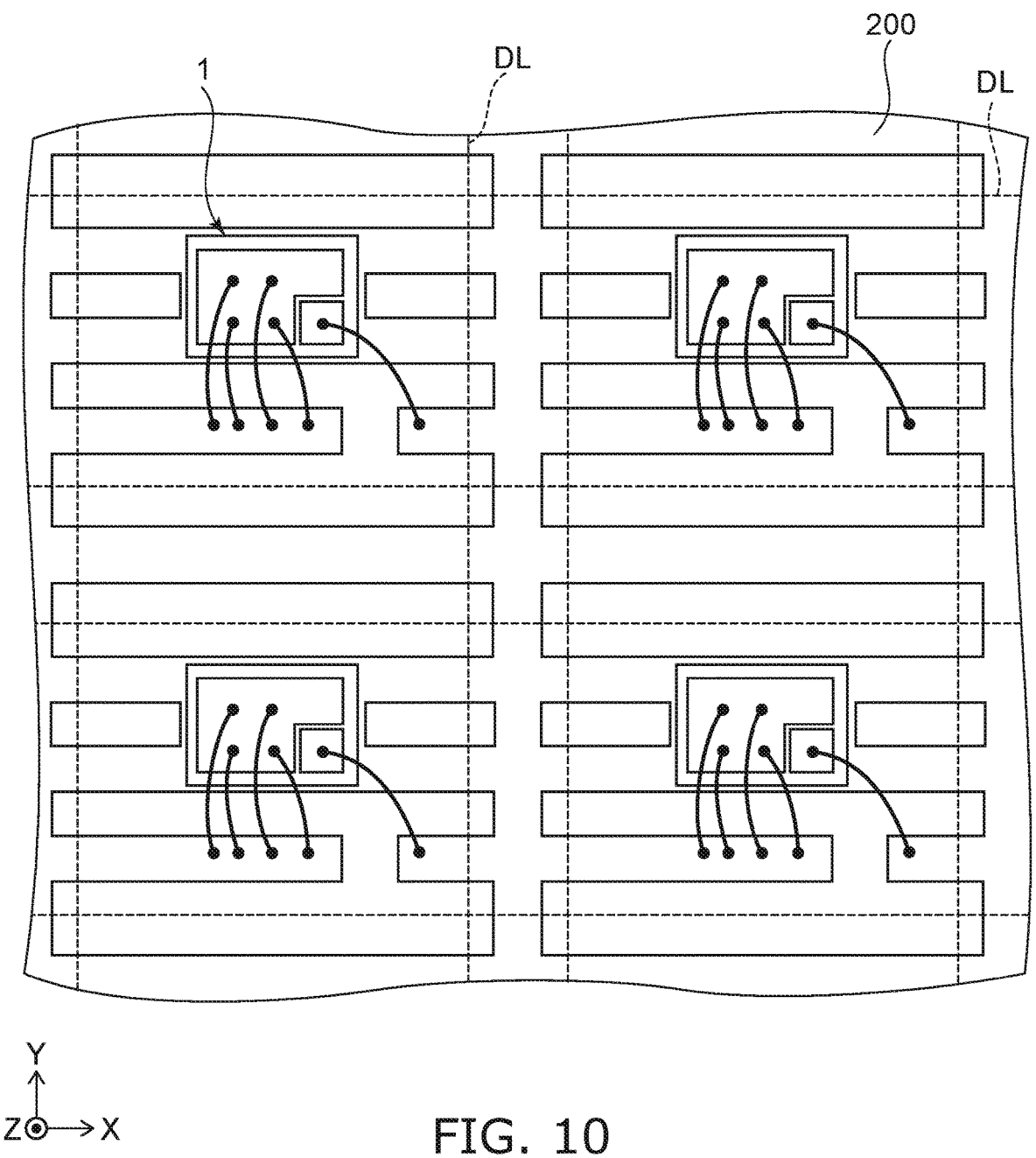
FIG. 10 is a schematic view illustrating the method for manufacturing the semiconductor device according to the embodiment.

FIG. 9A is a perspective view when a portion of the leadframe 200 after the electrolytic etching is viewed from below. FIG. 9B is an X-Z cross-sectional view passing through the first conductive part 11 and the terminal part 20t. In FIG. 9B, the broken line illustrates the position of the surface of the leadframe 200 before the electrolytic etching.

As shown in FIGS. 9A and 9B, the leadframe 200 is selectively etched with respect to the insulating portion 30 by the electrolytic etching. The burr B is removed by the electrolytic etching. The surface of the leadframe 200 recedes at this time. Therefore, the lower surface of the first portion 21 is positioned higher than the lower surface of the second insulating portion 32. However, the lower surface of the second portion 22 remains as-is, and is positioned lower than the lower surface of the first insulating portion 31.

By performing plating, the metal layers 25 are formed on the lower surfaces of the terminal parts 20t; and the metal layers 26 are formed on the lower surfaces of the first and second conductive parts 11 and 12. The multiple semiconductor devices 100 are obtained by cutting the leadframe 200 at the positions of the broken lines shown in FIG. 10. Thus, the semiconductor device 100 according to the embodiment is manufactured.

Advantages of embodiments will now be described.

Figure 11A:
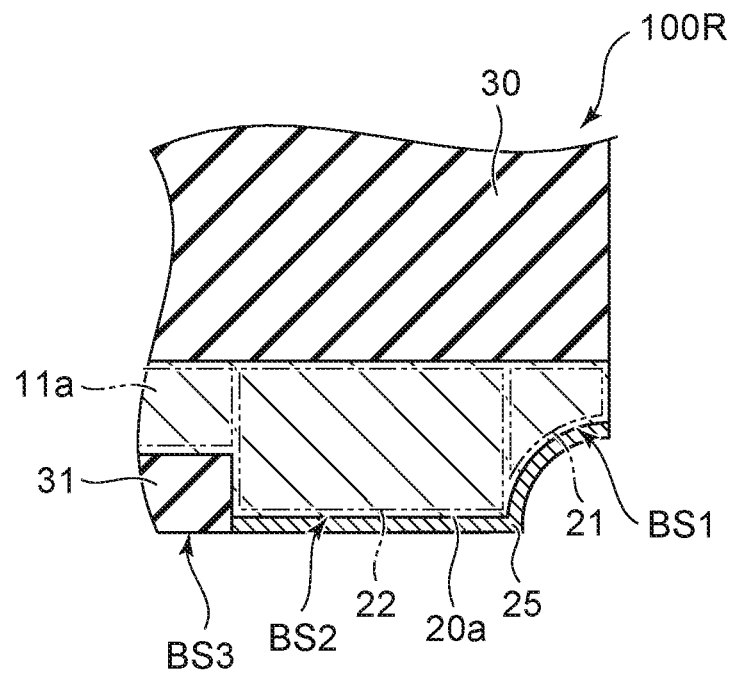
FIG. 11A is a cross-sectional view illustrating a portion of a semiconductor device according to a reference example.
Figure 11B:
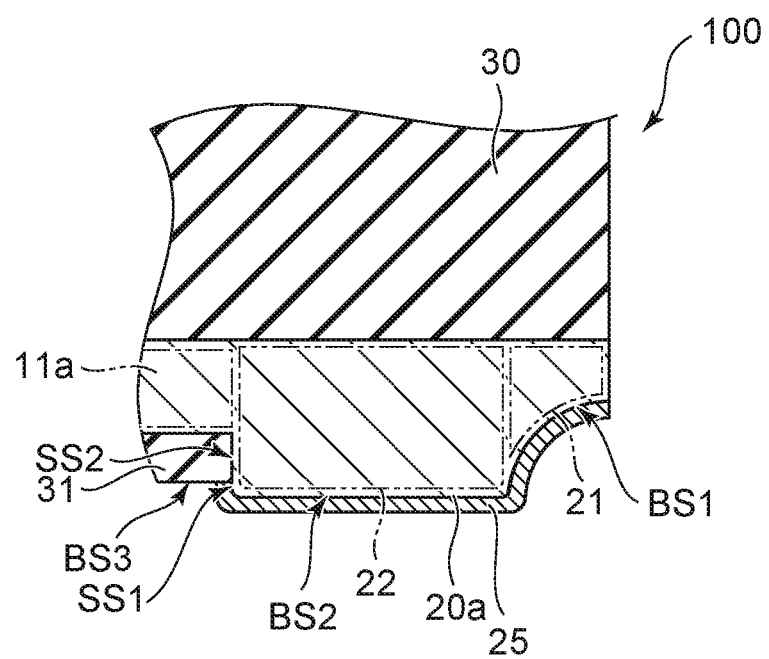
FIG. 11B is a cross-sectional view illustrating a portion of the semiconductor device according to the embodiment.

FIG. 11A is a cross-sectional view illustrating a portion of a semiconductor device according to a reference example. FIG. 11B is a cross-sectional view illustrating a portion of the semiconductor device according to the embodiment.

When the semiconductor device 100 is mounted to another device, the terminals 20 are bonded to the other device. The metal layers 25 are located at the surfaces of the terminals 20. The solder wettability to the metal layer 25 is better than the solder wettability to the terminal 20. In the semiconductor device 100, the lower surface BS1 is positioned higher than the lower surface BS2. When soldering the terminal 20, the solder creeps up along the lower surface BS1. Because the solder creeps upward, a visual inspection of whether or not the terminal 20 is appropriately bonded is possible.

To cause the lower surface BS1 to be positioned higher than the lower surface BS2, a portion of the terminal part 20t is removed by dicing as shown in FIG. 8. The burr B is formed at this time. It is desirable to remove the burr B because the burr B causes bonding defects of the terminal 20. For example, the burr B can be removed by wet etching. However, to remove the burr B or make the burr B sufficiently small, it is necessary to perform wet etching of the leadframe 200 for a long period of time. When wet etching is performed for a long period of time, the surface of the leadframe 200 is excessively removed. As a result, the lower surface BS2 becomes higher than the lower surface BS3 as shown in FIG. 11A.

In the semiconductor device 100 according to the embodiment as shown in FIG. 11B, the lower surface BS2 is positioned lower than the lower surface BS3. In such a case, the side surface SS1 of the second portion 22 is not covered with the insulating portion 30. The surface area of the second portion 22 is greater than when the lower surface BS2 is positioned higher than the lower surface BS3 as shown in FIG. 11A. In other words, the contact area between the solder of the terminal 20 is increased. As a result, when mounting or after mounting the semiconductor device 100, the likelihood of electrical connection defects between the semiconductor device 100 and the other device can be reduced. According to the embodiment, the mounting reliability of the semiconductor device 100 can be increased.

According to the embodiment as described above, electrolytic etching is used when etching the burr B. In electrolytic etching, the electric field concentrates and selectively etches sharp portions such as the burr B and the like. The etching amount of the lower surface of the first portion 21, the lower surface of the second portion 22, etc., can be reduced. As a result, the lower surface BS2 can be positioned lower than the lower surface BS3.

It is favorable for the metal layer 25 to be located at the side surface SS1 in addition to the lower surfaces BS1 and BS2. The surface area of the metal layer 25 is increased thereby, and the contact area between the metal layer 25 and the solder also is increased. The mounting reliability of the semiconductor device 100 can be further increased.

As shown in FIGS. 2A and 2B, the second insulating portion 32 may include the curved lower surface BS4. It is favorable for the lower surface BS1 not to be positioned too high compared to the lower surface BS4. When the lower surface BS1 is positioned excessively high compared to the lower surface BS4, the visual inspection of the solder that creeps up along the lower surface BS1 may be obstructed.

Therefore, it is favorable for the curvature of the lower surface BS4 to be greater than 1 times but less than 1.1 times the curvature of the lower surface BS1.

Modification

Figure 12A:
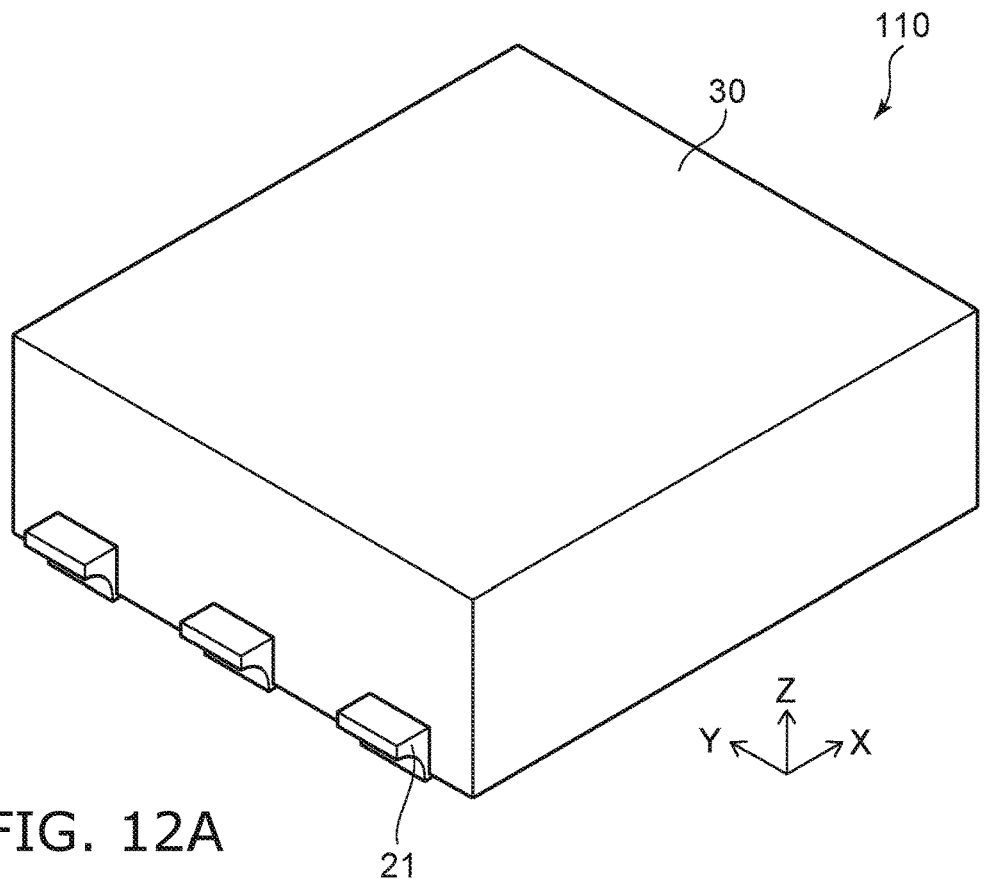
FIGS. 12A and 12B are perspective views showing a semiconductor device according to a modification of the embodiment.
Figure 12B:
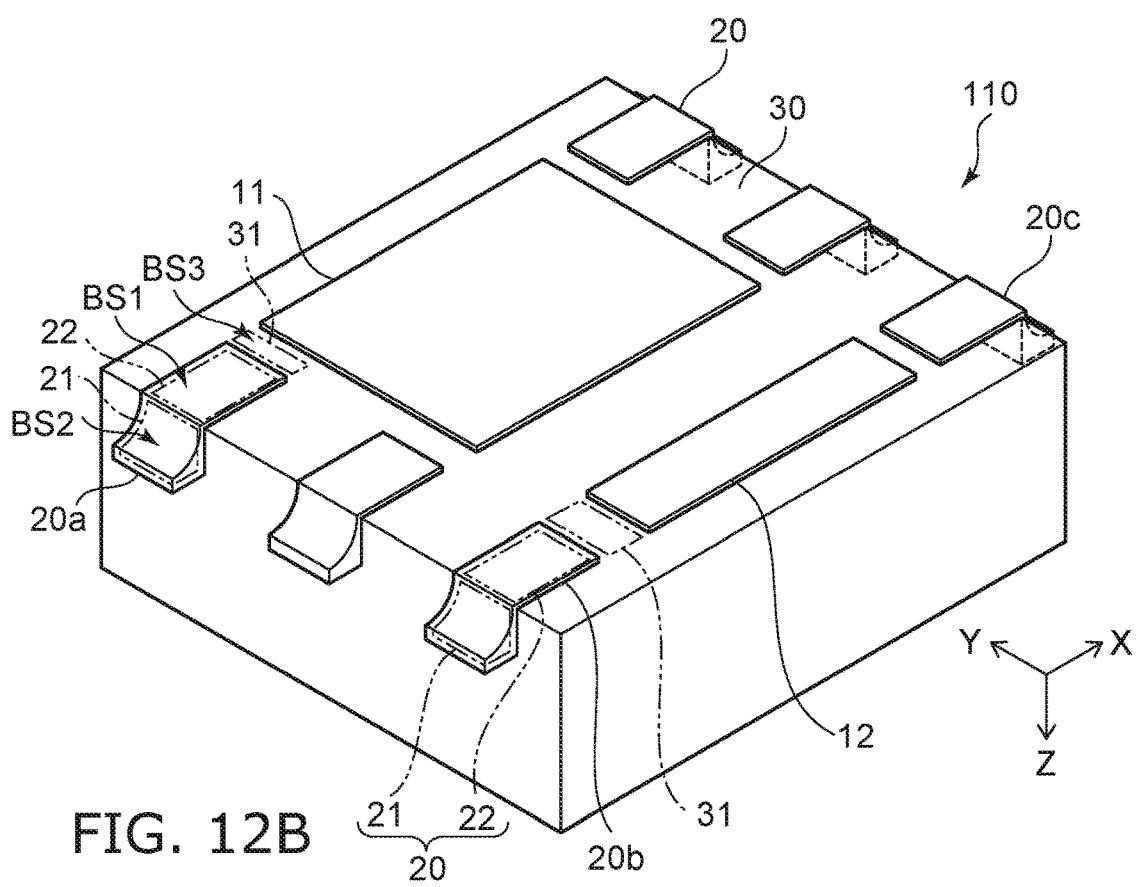

FIGS. 12A and 12B are perspective views showing a semiconductor device according to a modification of the embodiment. The metal layers 25 and 26 are not illustrated in FIGS. 12A and 12B.

In the semiconductor device 110 shown in FIGS. 12A and 12B, a portion of the upper surface of the terminal 20 is not covered with the insulating portion 30. The second insulating portion 32 is not located between the first portions 21. The second insulating portion 32 is omissible in the semiconductor device according to the embodiment.

In the semiconductor device 110, similarly to the semiconductor device 100, the lower surface BS2 of the second portion 22 is positioned lower than the lower surface BS1 of the first portion 21 and the lower surface BS3 of the first insulating portion 31. The surface area of the second portion 22 can be increased thereby, and the mounting reliability of the semiconductor device 110 can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first conductive part;
a semiconductor element located on the first conductive part;
a first terminal separated from the first conductive part in a second direction perpendicular to a first direction, the first direction being from the first conductive part toward the semiconductor element,
the first terminal including
a first portion, and
a second portion located between the first portion and the first conductive part,
a lower surface of the second portion being positioned lower than a lower surface of the first portion and lower than a lower surface of a first insulating portion, the first insulating portion being located between the first conductive part and the second portion;
a metal layer located at the lower surface of the first portion and the lower surface of the second portion; and
a second insulating portion arranged adjacent to the first portion in a third direction perpendicular to the first direction and second direction, a thickness of the second insulating portion decreases in the second direction away from the first conductive part,
wherein a lower surface of the first portion is positioned higher than a lower surface of the second insulating portion in a cross section taken along the first and third directions, and
wherein a side surface of the semiconductor device is parallel to the cross section taken along the first and third directions.

2. The device according to claim 1, wherein
the second portion includes a first side surface that crosses the second direction and is positioned lower than the lower surface of the first insulating portion, and
the metal layer is further located at the first side surface.

3. The device according to claim 2, wherein
the second portion includes a second side surface, and
the second side surface is positioned higher than the first side surface and contacts the first insulating portion.

4. The device according to claim 1, wherein
a plurality of the first terminals is arranged in the third direction,
the lower surfaces of the first portions of the plurality of first terminals are positioned higher than a lower surface of the second insulating portion in a cross section taken along the first and third directions, and
the second insulating portion is located between the first portions.

5. The device according to claim 4, wherein
a thickness of the first portion decreases away from the first conductive part, and
the lower surface of the first portion and the lower surface of the second insulating portion are curved to be upwardly convex.

6. The device according to claim 5, wherein
a curvature of the lower surface of the second insulating portion is greater than 1.0 times but less than 1.1 times a curvature of the lower surface of the first portion.

7. A semiconductor device, comprising:
a first conductive part;
a semiconductor element located on the first conductive part;
a second conductive part separated from the first conductive part in a third direction perpendicular to a first direction, the first direction being from the first conductive part toward the semiconductor element;
a plurality of terminals separated from the first and second conductive parts in a second direction with a plurality of first insulating portions interposed,
the second direction being perpendicular to the first and third directions,
the plurality of terminals including
a first terminal separated from the first conductive part, and
a second terminal separated from the second conductive part,
each of the plurality of terminals including
a first portion, and
a second portion, wherein the second portion is located between the first portion and the first conductive part or between the first portion and the second conductive part,
a lower surface of the second portion being positioned lower than a lower surface of the first portion and lower than lower surfaces of the plurality of first insulating portions;
a plurality of metal layers located respectively at lower surfaces of the plurality of terminals; and
a second insulating portion located between the first portions in the third direction, a thickness of the second insulating portion decreases in the second direction away from the first conductive part or the second conductive part,
wherein the lower surfaces of the first portions of the plurality of first terminals are positioned higher than a lower surface of the second insulating portion in a cross section taken along the first and third directions, and wherein a side surface of the semiconductor device is parallel to the cross section taken along the first and third directions.

8. The device according to claim 7, wherein
a thickness of each of the first portions decreases away from the first conductive part.

\* \* \* \* \*